United States Patent [19]  [11] Patent Number: 4,494,004
Mauer, IV et al.  [45] Date of Patent: Jan. 15, 1985

[54] ELECTRON BEAM SYSTEM

[75] Inventors: John L. Mauer, IV, Sherman, Conn.; Michel S. Michail, Wappingers Falls; Ollie C. Woodard, Poughkeepsie, both of N.Y.

[73] Assignee: International Business Machines Corporation, Armonk, N.Y.

[21] Appl. No.: 510,385

[22] Filed: Jul. 1, 1983

Related U.S. Application Data

[63] Continuation of Ser. No. 210,898, Nov. 28, 1980, abandoned.

[51] Int. Cl.³ .......................................... H01J 37/302
[52] U.S. Cl. .................................. 250/492.2; 250/398
[58] Field of Search ................... 250/492.2, 398, 492.3, 250/396 R

[56] References Cited

U.S. PATENT DOCUMENTS

| 3,900,737 | 8/1975 | Collier et al. | 250/492.2 |
| 4,099,062 | 7/1978 | Kitcher | 250/492.2 |
| 4,117,340 | 9/1978 | Goto et al. | 250/492.2 |
| 4,243,866 | 1/1981 | Pfeiffer et al. | 250/396 R |
| 4,282,437 | 8/1981 | Boie | 250/398 |

FOREIGN PATENT DOCUMENTS

| 118980 | 10/1978 | Japan | 250/492.2 |
| 118633 | 11/1980 | Japan | 250/492.2 |
| WO79/00900 | 11/1979 | PCT Int'l Appl. | |

OTHER PUBLICATIONS

Wilson et al., "Automatic Electron Beam Fabrication of Micron-Size Devices", Conf. Scanning Electron Microscopy, Part IV, Proc. Workshop on Microelectronic Device Fab. & Quality Control with the SEM, Toronto, Canada, Apr. 5–9, 1976, pp. 659–668.
Tarvi, "Basic Technology for VLSI", (Part II), IEEE Trans. Electron Devices, ED-27, (8), Aug. 1980, pp. 1321–1331.
Tarvi et al., "Electron Beam Exposure System for Integrated Circuits", Microlelectronics & Reliability, Pergamon Press, vol. 8, 1969, pp. 101–111.
Woodard et al., "Electron Beam Deflection Theoretical and Practical Limits of Performance", Extended Abstracts, vol. 80–81, May 1980, Princeton, p. 610.

Primary Examiner—Alfred E. Smith
Assistant Examiner—Carolyn E. Fields
Attorney, Agent, or Firm—Edward W. Brown

[57] ABSTRACT

An electron beam method and apparatus, for writing patterns, such as on semiconductor wafers, in which the writing field is divided into a large number of overlapping subfields with a predetermined periodicity. Subfield to subfield moves are made in a stepped sequential scan, such as raster, while patterns, within a subfield, are addressed using vector scan and written using a sequential scan. Significant improvement in throughput results by the use of this electron beam method and apparatus which preferably employs magnetic deflection for the sequential scanning the subfields and electric deflection for vector scanning within the subfield.

16 Claims, 8 Drawing Figures

ELECTRON BEAM SYSTEM

This is a continuation, of application Ser. No. 210,898 filed 11/28/80, now abandoned.

BACKGROUND OF THE INVENTION

1. Field of the Invention

This invention relates to an electron beam system and, more particularly, to electron beam system uniquely suited for writing both small and large areas, preferably, non-repetitive patterns, such as is required in the micro-fabrication of large scale integrated circuit patterns.

2. Description of the Prior Art

Electron beam columns have previously been used in systems for the micro-fabrication of large scale integrated circuits. Such columns have utility in writing patterns on substrates, such as on semiconductor wafers covered with photoresist, which is developed to form openings to the semiconductor wafer for further processing in integrated circuit fabrication. They also have utility in making masks for optical exposure, magnetic bubble fabrication, and optical data storage media fabrication. The function of any such system is to write a given pattern over a given area with a specified charge density and with adequate edge resolution in the shortest possible time. These patterns are made up of a plurality of pattern elements. The electron beam column must be designed such to achieve maximum throughput of semiconductor wafers while maintaining high quality exposure of the patterns. In cases where compatibility with other lithography systems is required, absolute deflection accuracy and especially repeatability are essential. In addition, for multi-level patterns, it is essential to be able to overlay the successive layers of the pattern with a high degree of accuracy. In view of the above requirements, various electron beam lithography systems have been designed and utilized. A typical electron beam system utilized in connection with integrated circuit micro-fabrication may include an electron beam source, condenser lenses, alignment stages, demagnification lens stages, a projection lens, a deflection unit, and a target area. For example, U.S. Pat. No. 3,644,700 issued Feb. 22, 1972 to Kruppa et al, describes a typical electron beam column. Other electron beam columns and components therefor are described in U.S. Pat. No. 3,949,228 to Ryan and U.S. Pat. No. 3,984,678 to Loeffler. Another type of electron beam column which has been adapted for micro-fabrication of integrated circuits utilizes a fixed shape beam spot. An example of such a electron beam column is described in the Kruppa patent. A square beam column exposes a number of image points in parallel and gains an equivalent factor in throughput over Gaussin spot or round beam electron beam columns. With a square beam column, the electron beam is focussed to provide a demagnified image of an aperture called the beam shaping aperture, which is square. The size of the focussed square spot is generally chosen to be the same as the minimum pattern line that is required and the optical system is designed so that the edge resolution of the spot is considerably less than this. Each pattern element is written by moving the shaped beam in discrete jumps so that the pattern is written as a series of squares.

The square beam imaging system has advantages over the Gaussin round beam system, as enumerated in the publication "New Imaging and Deflection Concepts For Performing Micro-fabrication Systems", by H. C. Pfeiffer, Journal of Vacuum Science and Technology, December 1975, Vol. 12, No. 6, pages 1170–1173. A further enhancement of the square beam imaging system is a variable shape electron beam column as described in copending application Ser. No. 771,235, now abandoned, for Method and Apparatus of Forming a Variable Sized Electron Beam, H. C. Pfeiffer, P. M. Ryan and E. V. Weber, filed Feb. 23, 1977, and assigned to the assignee of the present application. In this variable shape beam system, the deflection unit is placed between two beam shaping apertures. With the deflection unit switched off, the second square aperture is fully illuminated, thereby resulting in a square focussed spot of maximum dimensions. When the deflection unit is energized, the illumination of any portion of the second square aperture can be blanked off thereby producing a rectangle or a square spot of any desired size, up to the maximum, containing the same current density as the original square spot.

The above-described electron beam systems utilize a raster scan to write the patterns. The advantage of the raster scan is that the writing is the same for all of the patterns and errors may be measured and corrected prior to writing by the technique described in U.S. Pat. No. 3,644,700. The disadvantage of the raster scan is that the total field area must be covered even though the written area is only a small percentage of the field.

In contrast to the raster scan electron beam system, there is a system known as vector scan in which only the written area is scanned with a beam while non-pattern areas are skipped. This means that the exposure time can be reduced by the percentage of unwritten area. In the vector scan mode of computer controlled circuit pattern writing, as described in "A Computer-Controlled Electron-Beam Machine For Microcircuit Fabrication", by T. H. P. Chang and B. A. Waldman, in IEEE Transactions on Electron devices, May 1972 at pages 629–635, the pattern is divided into a series of rectangles and parallelograms. The electron beam is then controlled by the computer to access the rectangles and parallelograms sequentially to expose the inside of them. Throughput of such a system is dependent on the speed at which the semiconductor wafer can be exposed by the electron beam. Since exposure speed is limited by the current delivered to the wafer surface by the beam and the beam current is determined by the beam size, one of the major drawbacks of such a system is the limitation on throughput necessitated by the small beam size required to insure edge sharpness and accuracy. Prior art systems have attempted to solve this problem by making trade-offs between beam size on the one hand and edge definition and accuracy on the other. It was not feasible in the prior art systems to enlarge the size of the electron beam used to fill the inside of the circuit pattern, because the machine had to be powered down to change lenses in order to change the beam size. Therefore, the prior art electron beam systems were restricted to a speed determined by the electron beam size required for proper edge definition and accuracy. In addition, the vector writing approach with electron beam is inherently less accurate than a raster scan which has been corrected by a calibration scheme independent of the written patterns.

The above described prior art electron beam systems employ only a single deflection means, usually electric. An article by 0. C. Woodard et al entitled, "Variable Spot Shape Control Electronics", J. Vac. Sci Technol 16(6) November/December 1979 describes a dual deflection electron beam system for raster writing semiconductor wafers. The dual deflection aspect of this system gives greater speed and accuracy than a single deflection means but, because of the raster scan, the total field still must be covered to write only a small portion of the field.

SUMMARY OF THE INVENTION

It is a primary object of the present invention to provide a method and apparatus for exposing patterns with an electron beam with increased throughput, without sacrificing edge sharpness, accuracy and resolution.

It is a further object of this invention to provide an electron beam method and apparatus in which calibration is not pattern dependent.

A still further object of the present invention is to provide an electron beam method and apparatus which takes full advantage of variable shaped spot and vector scanning to maximize throughput.

Another object of the present invention is to provide an electron beam method and apparatus which also is capable of writing small and large areas with equal edge sharpness.

A final object of the present invention is to provide an electron beam apparatus which is capable of varying the beam exposure time per spot.

The foregoing objects are attained with an electron beam method and apparatus in which an electron beam is directed along a preselected path until it reaches one of a plurality of subfields of the writing field, and then the beam is intermittently blanked within the subfield to cause writing of patterns therein by vectoring from pattern element to pattern element and filling in each pattern element by sequential scanning, e.g. raster scanning.

That is, both sequential and vector writing systems are combined to provide an electron beam system with the advantages of both. The field is divided into a large number of overlapping subfields with a predetermined periodicity. Within each subfield, patterns are written as a series of elements, such as rectangles, which are addressed using vector scan. Subfield-to-subfield moves are made in a stepped raster mode with all subfields visited whether or not they contain patterns to be written. This regular and repetitive deflection pattern permits the use of an automated calibration system, so as to correct static and repetitive transient errors.

The advantages flowing from the electron beam system of the present invention is that pattern elements, such as rectangles, within a subfield are rapidly written utilizing, preferably, wide bandwidth circuitry to drive electric deflection plates at high speed for electric deflection. Deflection errors caused by electronic noise generated by the wideband circuits are not significant, because the deflection range is limited to very small subfields. To cause the subfield-to-subfield stepping, narrow bandwidth magnetic deflection circuits preferably drive a deflection yoke to cause magnetic deflection. Noise related errors are minimized because stepping time between subfields is relatively long. However, the number of subfields is relatively small when compared to the number of pattern elements. Accordingly, it has been found that a significant saving in writing time, or a significant improvement in throughput, results by the use of this dual deflection system over a single deflection system, without any loss of accuracy and resolution.

A further advantage results due to the subfield arrangement and vector writing and variable shaped spot capability within the subfield of the electron beam system. The periphery or sleeve part of each pattern element is written with a series of small rectangles by a small shaped spot for good edge definition, whereas the inside or full part of each pattern element, where edge slope accuracy is not required, is written with large spots. This allows better pattern resolution combined with reduced writing time and higher current density.

DETAILED DESCRIPTION OF THE DRAWINGS

DETAILED DESCRIPTION OF THE INVENTION

Figure 1:
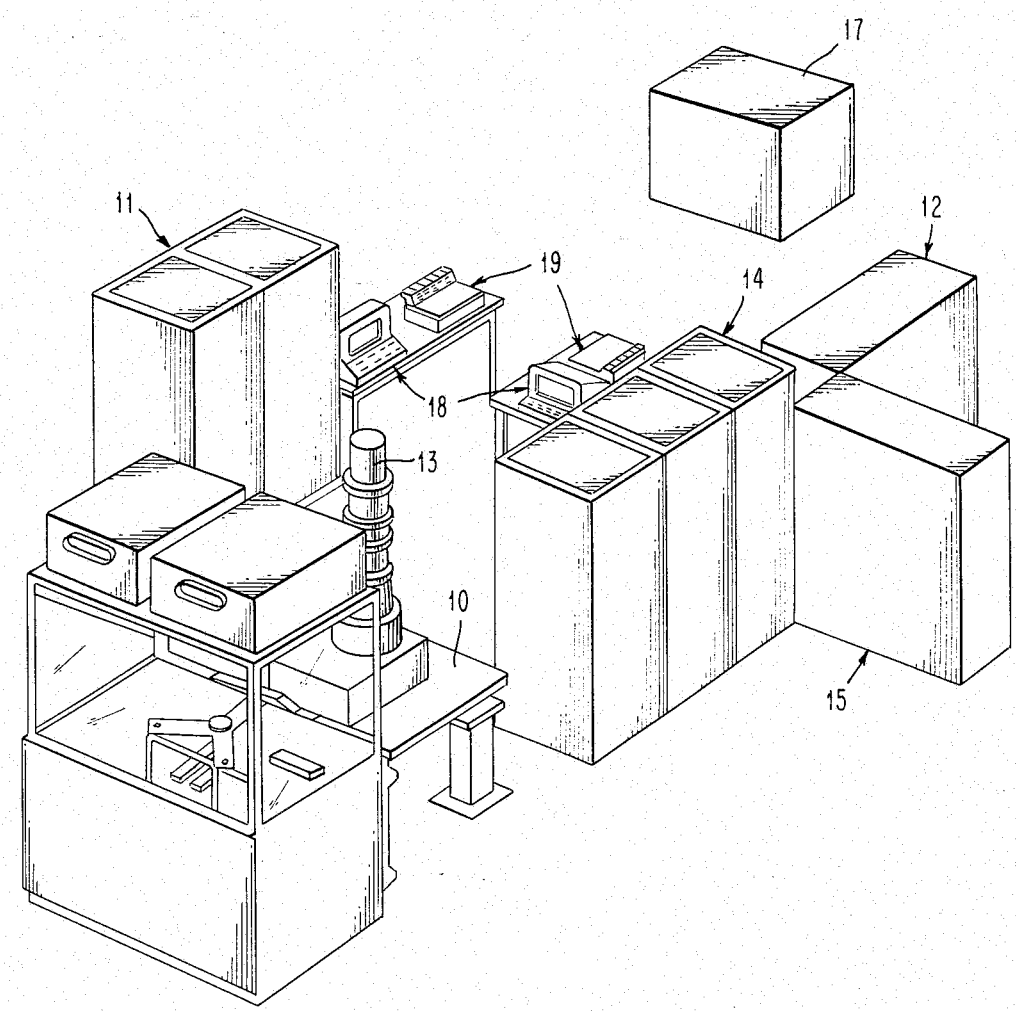
FIG. 1 is a perspective view of the computer controlled electron beam system of the present invention.

The overall electron beam system is shown in FIG. 1. Herein, semiconductor wafers entering the system are oriented and loaded onto a carrier (not shown), which is placed on an X-Y table 10 under vacuum. The mechanical and vacuum functions of the X-Y table are controlled by the mechanical interface unit 11, which contains analog and digital electronics which are controlled by a mechanical subsystem or minicomputer, such as an IBM Series I which in turn is controlled by the system controller 12, another minicomputer, again such as an IBM Series I.

A variable shaped spot size electron beam column 13 is mounted directly over the X-Y table 10, allowing it to write patterns on chip sites of the semiconductor wafer after the sites have been moved into position. A focus grid, calibration grid, registration marks, and a faraday cup are mounted on the X-Y table so as to permit both manual and automated calibration and diagnostics of the electron beam column. Diodes located above the table are utilized to detect back scattered electrons from registration marks and the calibration grid.

A column interface unit (CIU) 14 controls the electron beam size, exposure time, and positions for writing patterns as well as processing of back scattered signals for registration and calibration. This unit also powers the electron beam column and performs the beam quality maintenance functions of focus, current density, and alignment. As a further function, this unit expands pattern data from rectangle position and size to individual spot size and position.

To allow high speed access to pattern data so that throughput is not limited by data rates, the overall system includes a pattern buffer 15 which herein is at least an eight megabyte memory and is controlled by a pattern subsystem in the CIU 14. The pattern buffer is driven by a buffer power unit 17. The CIU 14 has direct access to the pattern buffer 15, which can be simultaneously back-filled with pattern data by the system controller 12. A resident pattern library, stored on disk files (not shown) is accessed by the system controller which transmits the data to the pattern buffer. This controller 12, which includes keyboard/CRTs 18 and printers 19, controls the overall system function.

Figure 2:
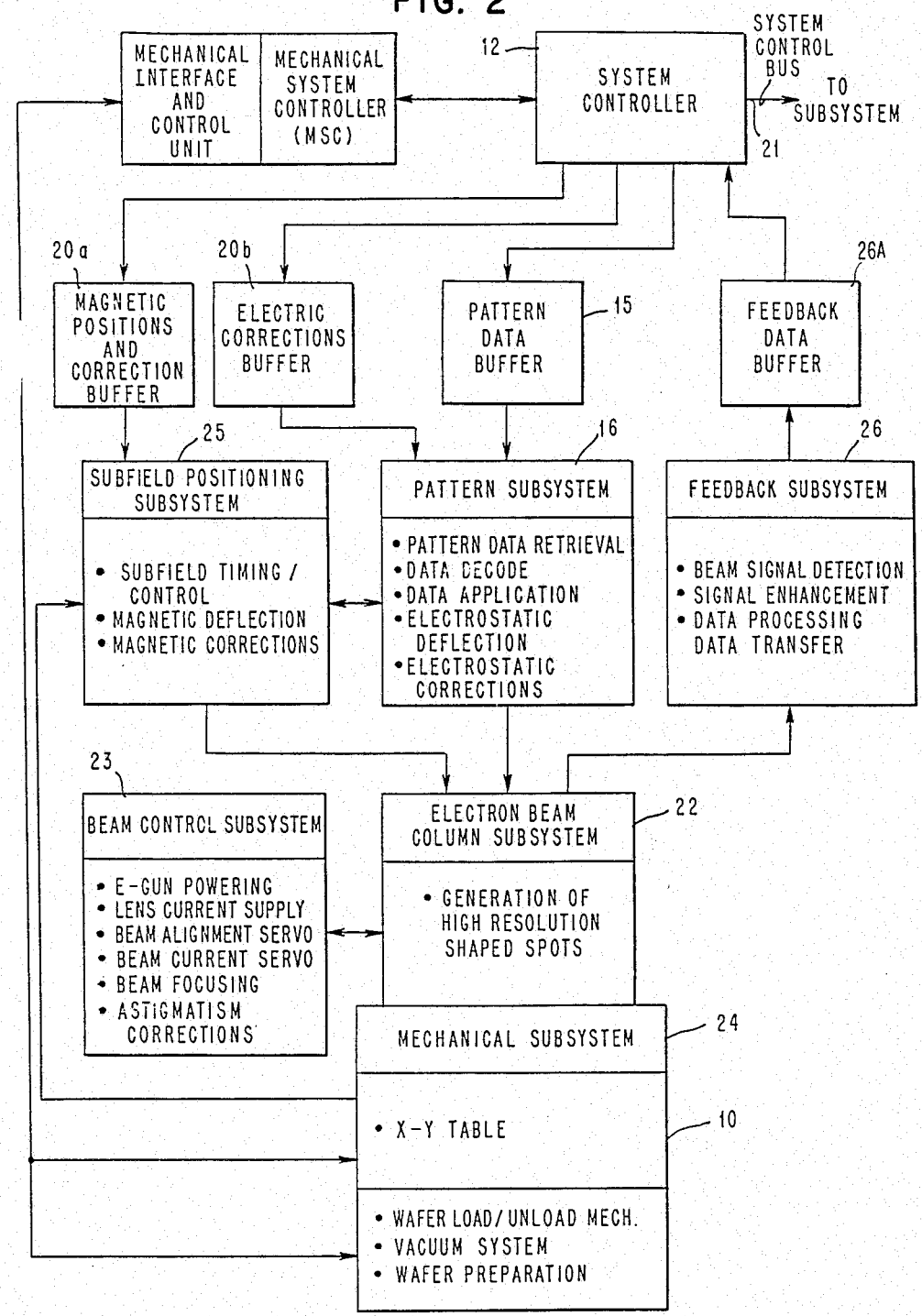
FIG. 2 is a block diagram of the various subsystems of the electron beam system of the present invention.

A more detailed showing of the overall computer control of the electron beam column of the present invention is shown in FIG. 2 in which it will be seen that the overall system is made up of a number of functional subsystems either directly or indirectly activated by the system controller 12. The system controller 12 communicates with the subsystems via external data buffers 15, 20a, 20b and a system control bus (SCB) 21, which allows the subsystem registers (not shown) to be read or written with control information. Process interrupts are used by the subsystems to inform the controllers of possible failure conditions or to synchronize various system operations. The overall electron beam system includes an electron beam column subsystem 23, a mechanical subsystem 24, a subfield positioning subsystem 25, a pattern subsystem 16 and a feedback subsystem 26. Except for the mechanical subsystem 24, the other subsystems are physically contained in the column interface unit 14 (FIG. 1). The mechanical subsystem 24 is associated with X-Y table 10 and the mechanical interface and mechanical system controller are physically contained in the mechanical interface unit 11 (FIG. 1).

Writing on the object, herein chip sites on a semiconductor wafer 52 (FIG. 4), is accomplished using three repeating cycles of operation: registration (A cycle), pattern writing (B cycle) and X-Y table 10 move to next chip site (C cycle). A magnetic deflection path which is used in each of these three cycles, is always active to retain deflection stability and, based upon the duration of each deflection path, provide the basic time of each. The ABC cycle sequence, therefore, is active even when no chip writing is taking place. With this background, the philosophy of the method of the system controller 12 is to minimally participate in the operation in order to achieve high throughputs. That is, the system controller presents control data to the subsystems designating the cycle during which an activity should occur. The activity then will begin at the start of the designated cycle, with no interruption to the ABC cycle sequencing. Accordingly, the synchronizing and control capability available to the system controller 12 is minimal, as is the cycle timing information sent to it by the subsystems. System controller can communicate with the subsystems via a system control bus (SCB) 21, a by-directional data bus, through which it can write or read registers in most subsystems. For example, it can set bits that designate a cycle during which a pattern should be written, and it could also set bits that cause a cycle (A, B or C) to be extended until that bit is reset. This is useful for the X-Y table 10 movements or registration that requires slightly more than the allotted cycle time, since it avoids skipping a full A, B, C cycle sequence. For writing a pattern on the chip site, pattern data, in the form of rectangular definitions, is transferred to the pattern subsystem 16 via the pattern buffer 15, which, in the present instance, is a memory with a minimum of eight megabytes data capacity. The system controller pre-loads this buffer with a required pattern and that initializes a pattern work count and memory address register in the buffer to point to a pattern to be written. A control word, which is sent to the subsystems via the SCB 21, designates the cycle in which the pattern is to be written. During the B cycle, pattern rectangle data is read from the buffer 15, expanded to spot definitions, and applied to the beam. The spot data includes positions, herein electric, within the subfield, spot shape, and exposure times. When the pattern subsystem has read out the last word, the pattern buffer 15 issues an interrupt to the system controller, which initializes the buffer for the next pattern. The use of the pattern buffer allows data to be asynchronously transferred to the pattern subsystem at rates as high as 12.5 megabytes/second while freeing the system controller to perform other services, such as backfilling the pattern buffer with required patterns not already in the buffer.

As previously stated, the writing field is divided into subfields and the spot is moved in a predetermined sequential fashion, herein bidirectional, to a particular subfield to write patterns. A specific number of subfields make up each of the three cycles (A, B and C) of operation. When a deflection is first started, system controller loads the subfield count for each cycle into registers in the subfield positioning subsystem 25, via the SCB 21. This allows the subfield positioning subsystem 25 to delineate A, B, and C cycles and synchronize all activities. After loading the subfield count for each cycle, magnetic deflection data and corrections to the writing fields are pre-loaded into two separate direct memory access buffers by the system controller. Both the electric correction buffer 20b and the magnetic positions/corrections buffer 20a are initialized in the same manner as the pattern buffer 15. Typically, however, this data remains the same throughout daily wafer writing unless a deflection field change is made. This means that the system controller is required to re-initialize each buffer back to the same starting point, once per A, B, C sequence. Once the buffers are loaded and enabled, the subfield positioning subsystem 25 reads the data with no system controller intervention and applies it to the electron beam column. The reading of these buffers and the re-initialization by the system controller is continuous to sustain a repetitive A,B,C magnetic deflection, whether a pattern is being written or not.

Figure 3:
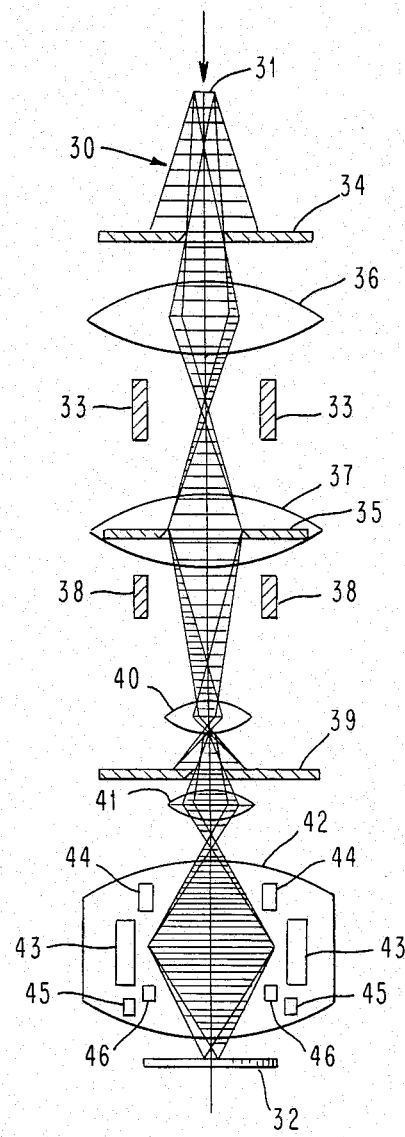
FIG. 3 is a cross-sectional schematic view of the electron beam column of the present invention.

Turning now to the electron beam column, FIG. 3 schematically shows the variable shaped spot, dual deflection column 30. Electrons from the source 31 on their way to a target plane 32, herein a semiconductor wafer, pass through spot shaping deflector plates 33 located between first 34 and second 35 spot shaping square apertures. By applying shaping voltage signals to the deflector plates 33 the first aperture image is caused to move laterally across the second aperture 35 to produce the desired spot shapes. First and second condenser lens 36 and 37 are positioned adjacent to the apertures 34 and 35 respectively, to focus the beam. To permit an off condition, blanking plates 38 are positioned below the second aperture 35 so that with voltage applied to the plates 38, the beam is deflected sufficiently to miss beam shaping round aperture 39. There is no spot movement in the target plane 32 caused by the blanking deflection. On opposite sides of the round aperture are first and second demagnification lens 40 and 41.

The foregoing was a description of the variable shaped spot aspect of the column 30, in which the first and second square aperture 34 and 35 shape the beam spot. Inasmuch as the image of the first square aperture 34 can be shifted laterally with respect to the second aperture 35, a predetermined fraction of the total beam, which depends on the signal applied to the electric shaping deflectors 33, passes through both apertures. The compound image formed by both apertures is sequentially demagnified and projected onto the target plane 32. The remaining portion of the column 30 is the projection lens 42 which includes the dual deflection as part of the column 30. Deflection yokes 43 are current driven by the magnetic deflection circuits to permit, in the present instance, bidirectional raster scanning from subfield to subfield. Within the subfield, electric deflection plates 44 produce vector scanning, rectangle to rectangle, to write the pattern on the target plane 32, herein a semiconductor wafer. Dynamic correction functions for focus and astigmatism are generated by analog circuits utilizing magnetic deflection signals as inputs and applied to a dynamic focus coil 45 and a dynamic stigmator 46.

In operation, a focus operation first checks the focus of the beam including its astigmatism. This is accomplished through using only the C cycle. Next, during calibration, the beam is operated only in the A and B cycles with the beam during C cycle being blanked so as to detect errors in deflection in the beam during the A and B cycles, first for the deflection of the beam in the X or horizontal direction and then for deflection in the vertical or Y direction. After the deflection errors for the beam in both the X and Y directions have been determined, correction equal and opposite to errors are generated and added to the deflection. The result is the beam being focused and calibrated properly.

For registration, only the A cycle is initially employed to locate wafer registration marks on a substrate, herein a semiconductor wafer. Then, during A cycle, registration marks associated with a chip site which is to have its resist exposed, are located. The error of registration mark's location is used to correct the writing field so as to match with the marks location. During the B cycle, the resist is exposed. During the C cycle, the beam is blanked, and the semiconductor wafer on the table is moved by moving the table to position another of the chip sites at the position in which the beam is registered. This site is now ready for exposure of its resist.

This operation continues until all the sites or a wafer have had their resist layer exposed in a predetermined pattern. Then, the wafer will be unloaded from the system while another wafer is loaded on the table. The above-described operation is repeated and continues until the focus and calibration operations are again required as determined by either the operator or by a mini calibration program that monitors the beam and deflections between wafers load/unloads.

Figure 4:
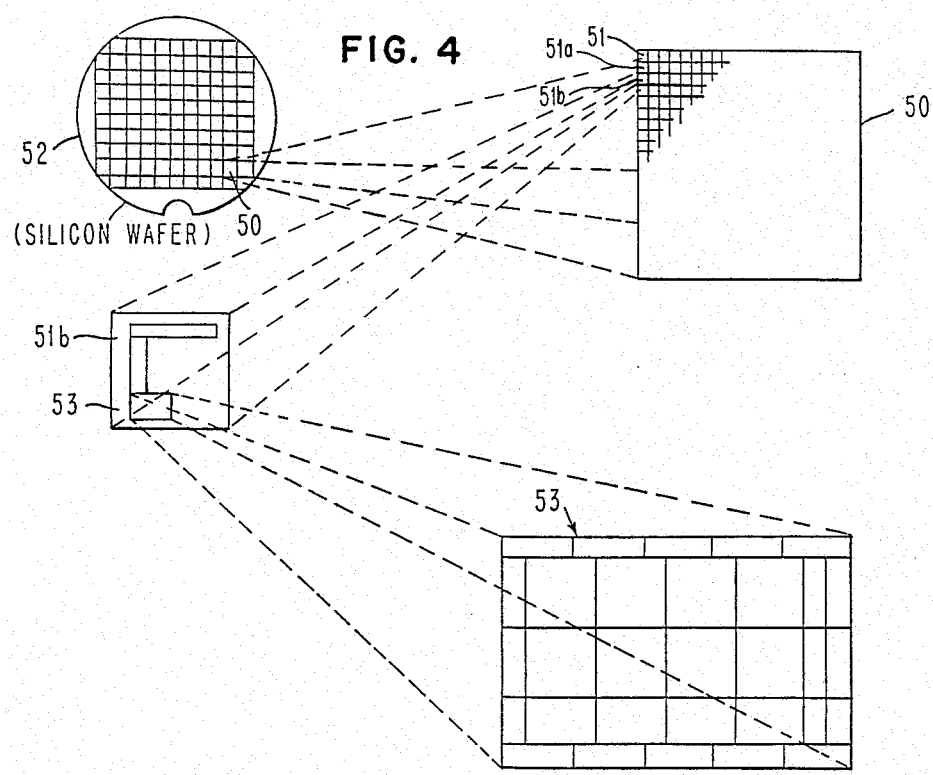
FIG. 4 is an example of a pattern written by the electron beam system of the present invention.

The pattern writing operation of the electron beam system of the present invention is best shown in FIG. 4. The writing field 50 is divided into a large number of overlapping subfields 51a, b . . . with a periodicity of, for example, 75 μm. Herein, the writing field 50 corresponds to a chip of a semiconductor wafer 52. Within each subfield 51 patterns, which are written as a series of rectangles 53, are addressed vectorially. Subfield-to-subfield moves can be made in any predetermined and repeatable path, herein a bidirectional stepped raster mode, with all subfields visited whether or not they contain patterns. This regular and repetitive deflection pattern allows for an automated calibration system which corrects static and repetitive transient errors.

Herein, rectangles 53 within a subfield are rapidly written in a unidirectional raster fashion utilizing wide bandwidth circuitry to drive electric deflection plates at high speed. The periphery of the pattern is formed of small pattern elements while the interior of the pattern is formed of larger pattern elements so as to maximize throughput without degrading edge sharpness. Deflection errors caused by electronic noise admitted by the wide band circuits are not significant, because the deflection range is limited, in the present instance, to 100 μm subfields. Narrow bandwidth magnetic deflection circuits drive the deflection yoke to cause the subfield-to-subfield bidirectional raster stepping. Noise related errors are kept to an acceptable value over a 10 mm range by the narrow bandwidth circuitry, which causes the stepping time between subfields to be relatively long. However, the number of subfields 51 is relatively small compared to pattern elements or rectangles 53. A significant savings in writing time results by use of this dual channel deflection system over a single channel system with equivalent errors.

To expand each rectangle into the required number of shaped spots by employing the spot shaping apertures 34 and 35 (FIG. 3) of the electron beam column pattern data, which herein is 8 bytes per rectangle, is contained in the pattern buffer 15 (FIGS. 1 and 2) and defines position, size, and control data for each rectangle. Control data includes variable exposure time (grey) so that each rectangle can have three specified values of grey, (1) an internal value, (2) an edge value, and (3) an alternate edge value—either of which can be applied to any edge.

Figure 5:
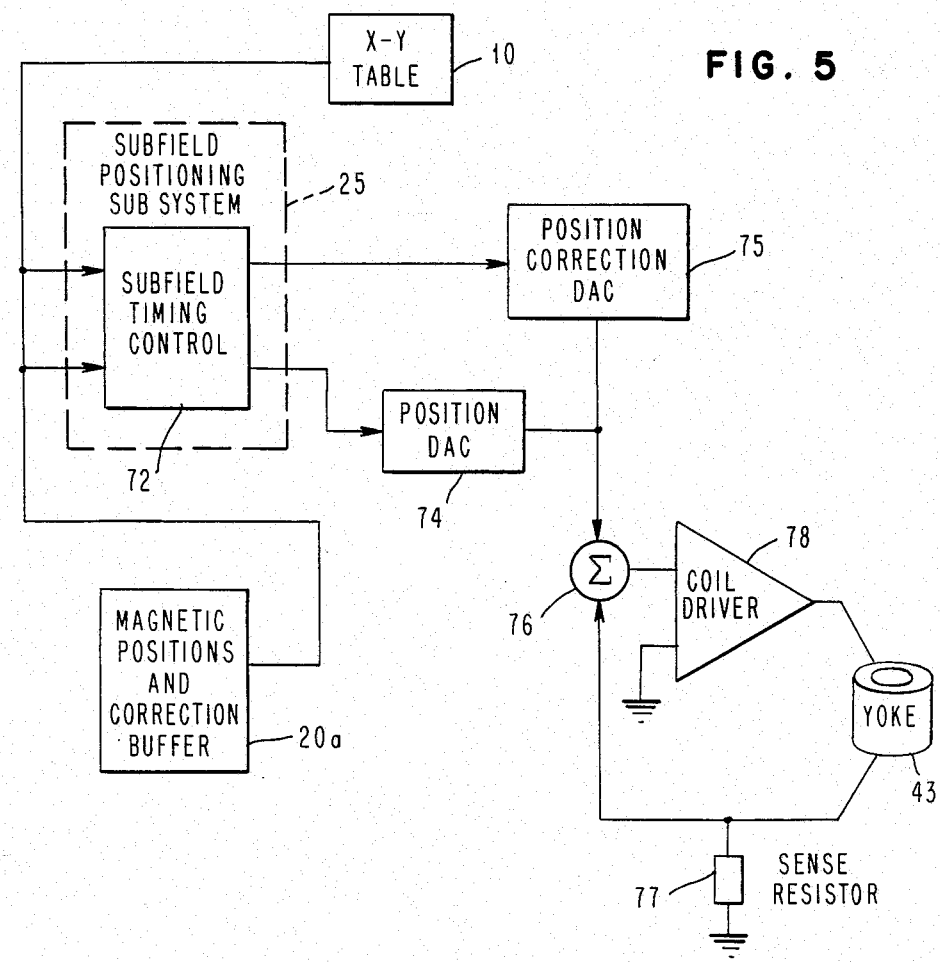
FIG. 5 is a block diagram of the magnetic deflection circuit of the present invention.

As shown in FIG. 5, to step the beam from subfield 51a to subfield 51b (FIG. 4), a subfield positioning subsystem 25, drives the magnetic deflection coil or yoke 43. The subsystem 25 comprises a subfield timing and deflection control 72 which receives the subfield position and correction data from buffer 20a and the position data is fed to a position digital-to-analog converter (DAC) 74, whereas the correction data is fed to correction DAC 75, the outputs of the DACs 74, 75 are fed to a summing circuit 76 which also receives an input of the present position of the beam from a sense resistor 77 connected between the magnetic deflection yoke 43 and the summing circuit 76.

The output of summing circuit 76 is the sole input to a coil driver 78 which produces the proper quantity of current for the yoke 43 for accurate placement of the beam within the desired subfield. Accordingly, the circuit 76 provides accurate positioning of the beam in each subfield while, at the same time, providing subfield position correction to compensate for field distortions and subfield center correction and field registration errors.

Figure 6:
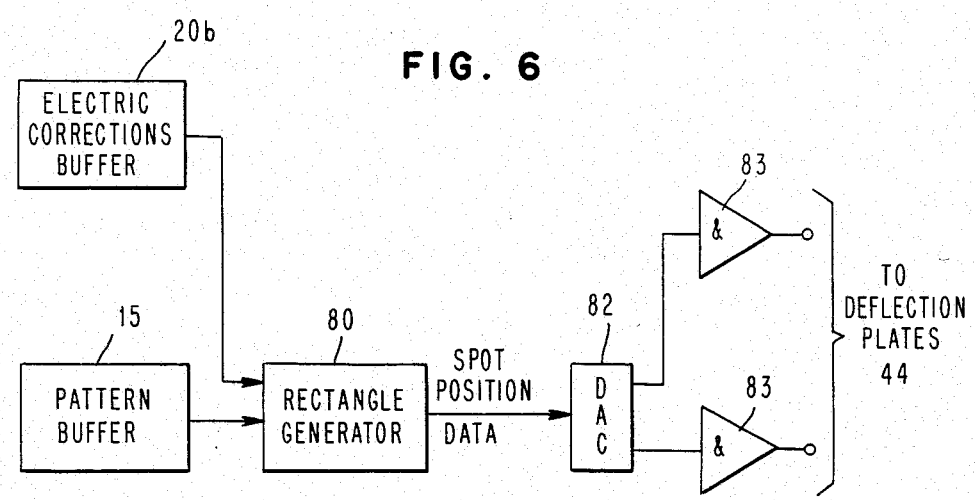
FIG. 6 is a block diagram of the electric deflection circuit of the present invention.

Once the beam is positioned in a subfield (for example 51b, (FIG. 4), the pattern to be written, in the present instance, is in the form of one or more rectangles, which are stored, as shown in FIG. 6, in the pattern buffer 15 as rectangle defining data. To interpret the rectangle defining data and convert it into a sequence of spot definition, a rectangle generator 80 connects the data it receives from the pattern buffer 15 and an electric correction buffer 20b. Upon converting the pattern into spot definitions, the rectangle generator 80 generates control signals relative to spot shape, spot position and exposure time. The signals relating to spot shape and exposure are fed to spot shaping plates 33 (FIG. 3) and blanking plates 38 (FIG. 3). The correction data from the buffer 15 is added to the spot position data to yield a corrected spot position signal which is fed to a digital-to-analog converter (DAC) 82, whose output is fed via amplifiers 83 to deflection plates 44. Because a fast settling time is required, the output of the DAC 82 is, herein, fed to a fast analog switch (not shown) commutating between two identical signal channels (not shown) so that the deflection plates are connected to that channel in which the signal has become settled.

Figure 7:
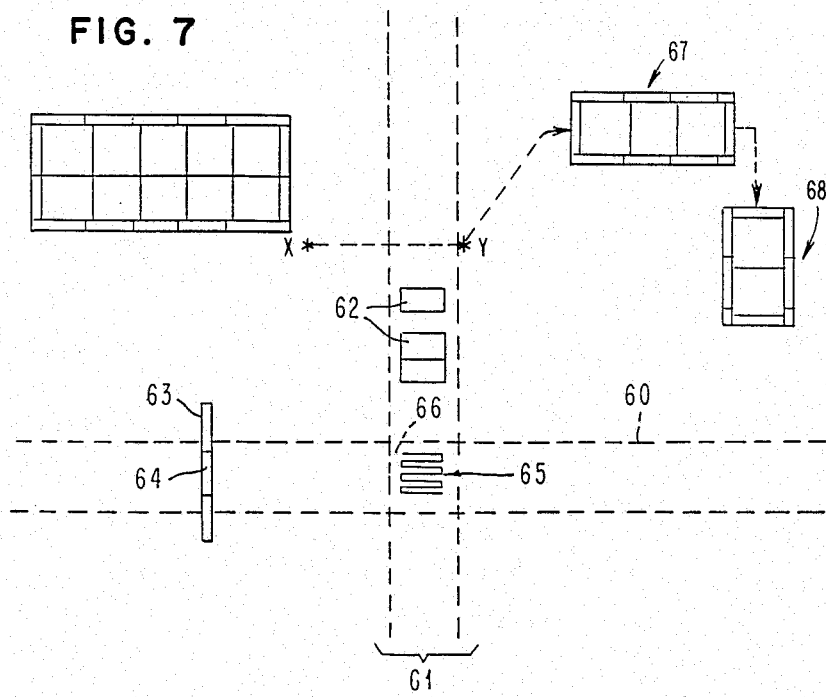
FIG. 7 shows the subfield writing technique of the present invention.

To show how a number of different patterns are written, reference is made to FIG. 7. The subfields are shown in dashed lines 60 with subfield overlap 61 which allows calibration of common points within the overlap 61 to assure subfield boundary matching. Shapes which end or fall within the overlap 61, such as shapes 62 are written in one subfield only. However, shapes which cross subfield boundaries, such as shape 63, are spliced by overlaying the common spot 64 with one half normal exposure (grey) in both subfields. This "grey splice" technique minimizes the effect of subfield boundary matching errors.

In operation as shown by FIG. 7, the electron beam is moved from subfield position X by magnetic deflection to position Y in adjacent subfield. The beam is vectored electrostatically to the rectangle 67 which is written or exposed using an electrostatic raster scan. When the writing of rectangle 67 is completed, the beam is vectored electrostatically to rectangle 68 to write that rectangle.

A registration procedure is performed during the A-cycle of the A-B-C operation cycle of the system so as to align the E-beam pattern writing deflection to the chip site on the wafer. X and Y marks, which are located in the four corners of the chip are scanned and data is collected simultaneously. (Further details about registration mark detection can be found in U.S. Pat. No. 4,056,730, Nov. 1, 1977, D. E. Davis et al). Collected data is digitized and fed to the feedback subsystem 26 (FIG. 2) which processes feedback data and transfers the reduced data back to the feedback buffer 26A (FIG. 2). The control computer 12 edits this data as it is read from the feedback buffer and the marks displacements from their expected locations are determined. Upon locating all of the alignment marks, a set of corrections is generated (A,B,C,D,E,F,G,H) which modifies field translation, rotation, magnification and distortion in X and Y. (Further details of registration correction can be found in U.S. Pat. No. 3,900,736, Aug. 19, 1975, M. S. Michail et al). These corrections are sent to eight registers within the subfield positioning subsystem 25 (FIG. 2) via system control bus 21 (FIG. 2). The registration corrections will correct not only the magnetic position of every subfield but also it will affect the electric position of every spot within any subfield. The registration correction are added digitally to the field correction and applied to the magnetic deflection and the electric deflection as will be described in reference to FIG. 8. The addition and application of correction is within the subfield positioning subsystem 25 (FIG. 2) and pattern subsystem 16 (FIG. 2).

It should also be understood when a wafer is loaded in the system the control computer 12 (FIG. 2) directs the X-Y table to move to the first site. This shall be a unique site which contains large alignment marks to accommodate initially large wafer positional errors. This wafer registration procedure is functionally the same as chip registration procedure.

A calibration procedure is provided to measure monitor, and correct the beam positioning distortion of both the magnetic and electric deflection systems. Distortions measurement is accomplished by using, herein, a grid of gold bars on silicon (not shown) which is mounted on the X-Y table 10 (FIG. 1) underneath the beam. The grid is scanned resulting in a modulation of back-scattered electrons which are intercepted by solid state diode detectors (not shown) located above the target place. The back-scattered signal is filtered, summed and analog-to-digital converted. Digital processing of feedback signals includes noise and data reduction by digital averaging at the feedback subsystem 26 (FIG. 2) which also provides hardware editing of data to check that it is within predetermined tolerances. Subsystem 26 performs digital clipping to determine relative position of the scans with respect to the target. Scans 65 (FIG. 5) are made within the overlapping corners 66 (FIG. 5) of the subfields so that scans from adjacent subfields are over a common calibration grid element. This enables corrections to be generated corresponding to the most suitable linear fit of deflection for each subfield. As a result, the subfields will be stitched together to produce a total field of specified size, herein—10 mm by 10 mm. Two collect cycles are used; one for horizontal measurements and another for vertical measurements. The data is then transferred to the control computer 12 (FIG. 2) for analysis. The output is the following set of linear correction parameters for each subfield:

a. $A_i$: Subfield X position correction
b. $B_i$: Subfield X size correction
c. $C_i$: Subfield X rotation correction
d. $D_i$: Subfield X trapezoidal correction
e. $E_i$: Subfield Y position correction
f. $F_i$: Subfield Y rotation correction
g. $G_i$: Subfield Y size correction
h. $H_i$: Subfield Y size trapezoidal correction The correction at any spot ($X_e$, $Y_e$) within any subfield (i) is given by:

$$\Delta X_e = A_i + B_i X_e + C_i Y_e + D_i X_e Y_e$$

$$\Delta Y_e = E_i + F_i X_e + G_i Y_e + H_i X_e Y_e$$

Figure 8:
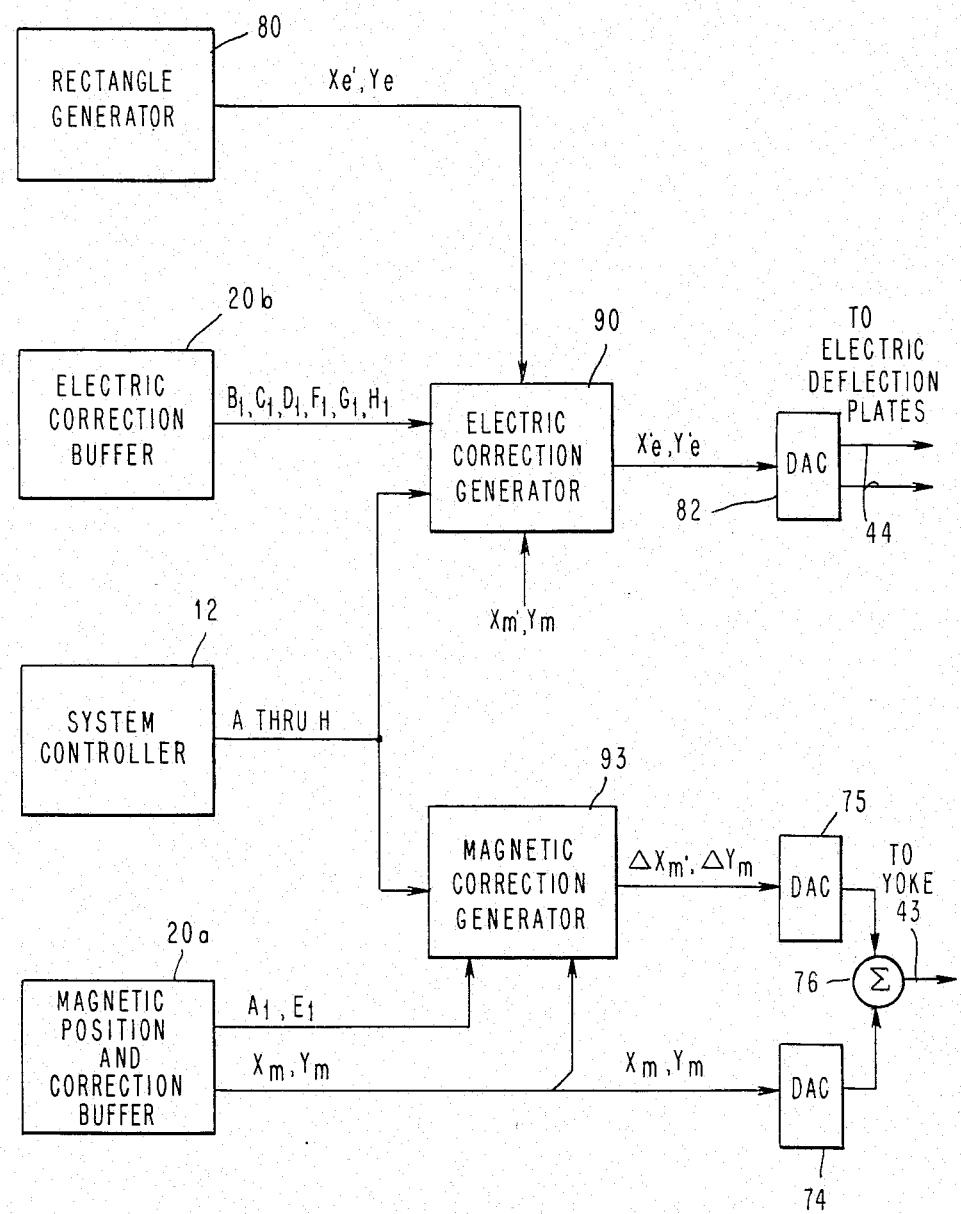
FIG. 8 is a block diagram of the calibration system of the present invention.

Both $A_i$ and $E_i$ terms are combined with subfield position addresses and, as shown in FIG. 8., loaded in the magnetic position and correction buffer 20a along with the magnetic position $X_m$, $Y_m$. The remaining terms $B_i$, $C_i$, $D_i$, $F_i$, $G_i$ and $H_i$ are loaded in the electric correction buffer 20b. These latter digital correction terms are then transferred from the buffer 20b to electric correction generator 90 of the pattern subsystem 16 (FIG. 2) to generate corrections $\Delta X_e$ and $\Delta Y_e$ at any spot ($X_e$, $Y_e$) received from the pattern buffer 16 within any subfield i whose magnetic position is ($X_m$, $Y_m$) as received from the magnetic position and correction buffer 20a, and as modified by registration corrections received from system controller 12. Fast and small range terms are generated and added digitally to the spot position ($X_e$, $Y_e$) to yield a spot address ($X'_e$, $Y'_e$) which is fed to DAC 82, which generates a corresponding analog signal to apply to the deflection plates 44 (FIG. 3). Slow and large range terms ($\Delta X_m$, $\Delta Y_m$) are generated in the magnetic correction generator 93 from data in terms of ($A_i$, $E_i$) and ($X_m$, $Y_m$) from the magnetic position and correction buffer 20a and the registration correction terms from the system controller 12, and are fed to DAC 75. The magnetic position terms ($X_m$, $Y_m$) also are fed to DAC 74 and the analog signals from DAC 74 and DAC 75 are added in the summing circuitry 76 and its output signal is fed to the yoke 43 (FIG. 3).

The electric deflection for subfield i is governed by the equations:

$$X'_e = X_e + (B + B_i + DY_m)X_e + (C + C_i + DX_m)Y_e + (D + D_i)X_eY_e$$

$$Y'_e = Y_e + (F + F_i + HY_m)X_e + (G + G_i + HX_m)Y_e + (H + H_i)X_eY_e$$

while the magnetic deflection for subfield i is governed by the equations:

$$X'_m = X_m + A + A_i + BX_m + CY_m + DX_mY_m$$

$$Y'_m = Y_m + E + E_i + FX_m + GY_m + HX_mY_m$$

While our invention has been particularly shown and described with inference to the preferred embodiment thereof, it will be understood by those skilled in the art that changes in form and detail may be made without departing from the spirit and scope of our invention.

Having thus described our invention, what we claim as new, and desire to secure by Letters Patent is:

1. In an electron beam system adapted for writing patterns within a writing field comprising:
   means for defining an electron beam of predetermined cross section and density;
   means for focusing said beam on a target area within the writing field;
   means for successively directing the beam, while blanked, along a path of a plurality of subfields of the writing field by a first deflection means until it reaches a preselected subfield; and
   means for vectoring the beam, while blanked, to a preselected area within said subfield with a second deflection means, whereat the beam is unblanked and a predetermined pattern is written in the preselected area by the beam while the target area is stationary.

2. The electron beam system of claim 1 wherein the first deflection means comprises magnetic means for scanning the beam to and positioning the beam in said preselected subfield.

3. The electron beam system of claim 1 wherein the second deflection means comprises electric means for vectoring the beam within the subfield to a pattern for writing thereof.

4. The electron beam system of claim 3 wherein each predetermined pattern within said preselected subfield is composed of one or more pattern elements connected to each other to form the pattern, and wherein the electric deflection means vectors the beam to a pattern followed by successively scanning each of the pattern elements to write the pattern.

5. The electron beam system of claim 4 wherein the periphery of the pattern is formed of small pattern elements while the interior of the pattern is formed of larger pattern elements so as to maximize throughput without degrading edge sharpness.

6. The electron beam system of claim 1 wherein said means for defining the electron beam comprises a spot shaping deflector and first and second spot shaping apertures so that, when shaping voltage signals are applied to the deflector, the first aperture beam image is caused to move laterally across the second aperture to permit varying the spot cross section.

7. The electron beam system of claim 1 wherein the system includes means for calibrating common points within overlapping adjacent subfields so as to assure subfield boundary matching.

8. The electron beam system of claim 7 wherein a predetermined pattern crosses over the boundary of two subfields and wherein said system includes means for controlling the exposure time of the beam so that a pattern element of the pattern in subfield overlap is during each subfield writing exposed at about one half the normal time used in the exposure of a pattern element in each subfield.

9. A method of writing patterns with an electron beam comprising the steps of:
   defining a predetermined cross section and density of the electron beam;
   focusing the beam on a target area with a writing field;
   successively directing the beam, while blanked, along a path of a plurality of subfields of the writing field until it reaches a preselected subfield; and
   vectoring the beam, while blanked, to a preselected area within one of said subfields, whereat the beam is unblanked and a predetermined pattern is written in the preselected area by the beam while the target area is stationary.

10. The electron beam writing method of claim 9 wherein the beam is magnetically deflected across the subfields and positioned in said one subfield.

11. The electron beam writing method of claim 9 wherein the beam is electrically vectored within said one subfield to a pattern for writing thereof.

12. The electron beam writing method of claim 11 wherein each of the predetermined patterns within said one subfield is composed of one or more pattern elements connected to each other to form the pattern, and wherein the beam is electrically vectored to a pattern followed by successively scanning each of the pattern elements to write the pattern.

13. The electron beam writing method of claim 12 wherein the pattern is written by scanning the periphery of the pattern which is formed of small pattern elements and the interior of the pattern which is formed of larger pattern elements so as to maximize throughput without degrading edge sharpness.

14. The electron beam writing method of claim 9 wherein the electron beam's cross section and density are defined by passing the beam through first and second apertures and deflecting the beam after it passes through the first aperture to cause the beam to move laterally across the second aperture so as to permit varying the beam cross section.

15. The electron beam writing method of claim 9 wherein common points within overlapping adjacent subfields are calibrated so as to assure subfield boundary matching.

16. The electron beam method of claim 15 wherein a predetermined pattern crosses over the boundary of two subfields, and wherein the beam's time of exposure is controlled so that a pattern element in the subfield overlap is during each subfield writing, exposed at about one half the normal time used in the exposure of a pattern element in each subfield.

* * * * *